Feb. 27, 1968 F. H. REES 3,371,283

ELECTRICAL CIRCUITS

Filed Dec. 5, 1963 2 Sheets-Sheet 1

Inventor
FREDERICK H. REES
By [signature]
Attorney

Feb. 27, 1968 F. H. REES 3,371,283

ELECTRICAL CIRCUITS

Filed Dec. 5, 1963 2 Sheets-Sheet 2

Inventor
FREDERICK H. REES
By Percy P. Lantzy
Attorney

United States Patent Office 3,371,283

Patented Feb. 27, 1968

3,371,283

ELECTRICAL CIRCUITS

Frederick Henry Rees, London, England, assignor to International Standard Electric Corporation, New York, N.Y., a corporation of Delaware Filed Dec. 5, 1963, Ser. No. 328,267
Claims priority, application Great Britain, Dec. 20, 1962, 48,147/62
3 Claims. (Cl. 330—20)

ABSTRACT OF THE DISCLOSURE

A transistorized amplifier circuit arrangement in which all stages but the final stage are connected in emitter follower configurations having their collectors connected together and to a bias source through a resistor. The collector of the final stage is connected to the common collector connection thru a diode. In this circuit arrangement only the first stage can saturate in response to an input pulse.

The present invention relates to a transistor amplifier, and especially to such an amplifier which has to operate at high speed and to handle relatively large power.

Such amplifiers are known in which two stages are used, the transistors of the two stages being connected together and the first stage used, in effect, as a driver for the second stage. In such a circuit the use of a fast transistor in the first stage tends to unduly limit the amplifier's power-handling capabilities, and it is an object of the invention to provide a circuit in which this disadvantage is at least minimised.

According to the present invention there is provided a transistor amplifier circuit which comprises two or more stages each including a transistor, each said transistor except that of the last stage being in the common collector configuration and having its emitter connected to the base of the transistor of the next stage, connecting means whereby all of said transistors have their collectors connected together and to a bias source, a diode in the connection between the collector of the last stage transistor and the bias source, said diode ensuring that although the collector voltage swing of each transistor other than that of the last stage is limited by said voltage source, the collector voltage swing of said last stage transistor is not limited by said bias source, and a connection from the collector of the last stage transistor to the load to be driven by the amplifier, the arrangement being such that although the first stage transistor can bottom in use the last stage transistor cannot bottom in use.

Embodiments of the present invention will now be described with reference to the accompanying FIGS. 1, 2, 3 and 4.

Figure 1:
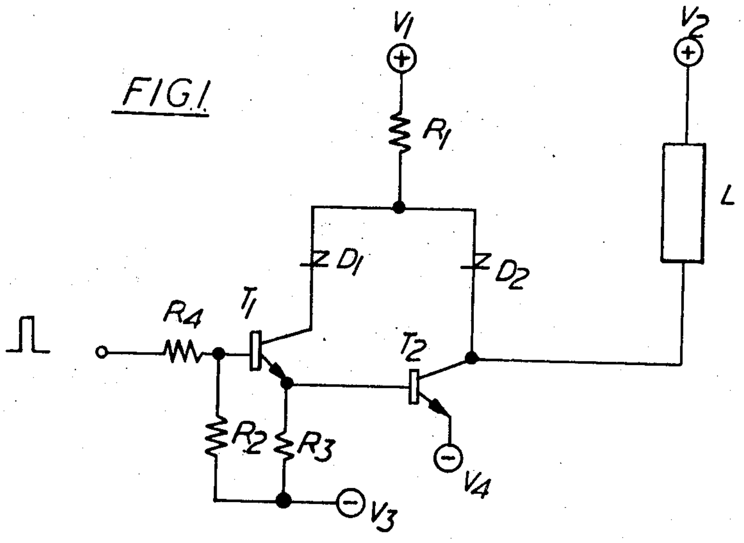
FIG. 1 shows a first embodiment of the invention including two stages of NPN transistors.

In the circuit of FIG. 1, which uses NPN transistors, the collectors of the two transistors T1, T2 are connected via semi-conductor diodes D1 and D2 and a resistor R1 to a bias source V1, which can be earth or a positive voltage. The collector of T2 is also connected via the amplifier's load L to a source V2 of a voltage higher than V1. In one case V1 is earth and V2 is 30 volts. The negative bias sources V3 and V4 also supply different voltages, V3 being a greater (i.e., more negative) voltage than V4, in one case V3 being −10 volts and V4 −8 volts. The resistor R2 in FIG 1 has a higher value than does R3.

The first stage formed by T1 is, in effect, an emitter follower whose function is to pull on and off the power amplifier formed by T2, which latter also acts as an inverter. Due to the connection of its collector via the resistor R1 to a relatively positive potential—in the circuit shown earth—the maximum voltage swing difference between the collector and the emitter of T1 is somewhat less than 8 volts.

When a positive-going signal occurs on the base of T1, it drives the latter into saturation, i.e., it bottoms T1, and the current applied thereby to the base of T2 renders the latter conductive so that a high current flows therein, although, due to its connection to V1, the maximum swing of the collector of T1 cannot exceed 8 volts. The diode D2, between the collector of T2 and V1, serves to block the relatively large voltage change produced at the collector of T2 due to V2 from the other transistor T1. Thus although there is no limitation on the voltage swing of the collector of T2, apart, of course, from that due to the supply voltage V2, the driving transistor T1 has its collector voltage swing limited. Since T2 never bottoms, by virtue of the feedback action through common resistor R1, the pulse which is applied to the load L has sharp leading and trailing edges. That is, delays due to the transistor bottoming or unbottoming are not liable to cause a degradation of the pulse shape.

In summary, a positive signal applied at the base of T1 drives it into saturation with its collector voltage swing limited by virtue of its connection to a relatively positive potential V1 through R1. When T1 turns "on," T2 is made conductive. The collector voltage swing of T2 is not limited by V1 but depends on V2, and D2 serves to block the larger voltage swing of T2 from the other transistors. In addition, T2 cannot saturate because of negative feedback action through R1, D1, T1 to the base of T2, this causes T2 to always operate short of its saturation level.

Figure 2:
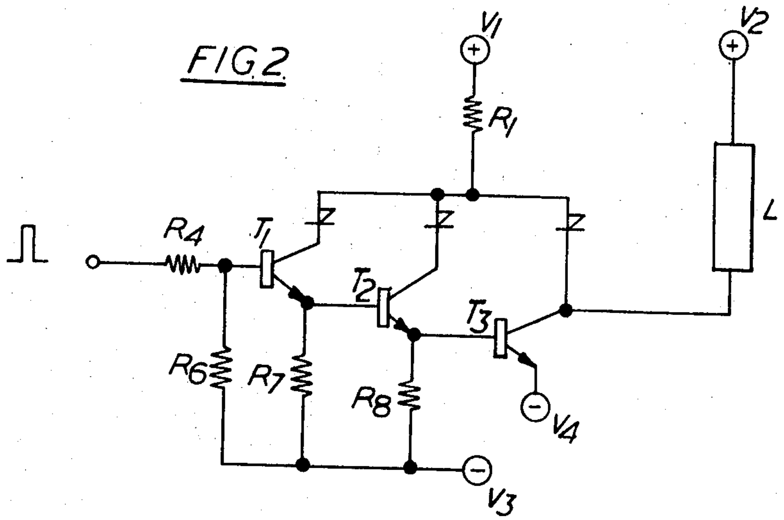
FIG. 2 shows a second embodiment of the invention utilizing three stages of NPN transistors.

The circuit shown in FIG. 2 is generally similar in operation to that of FIG. 1 and hence little description thereof is needed. In this case, the additional transistor as compared with FIG. 1 provides a greater gain, and the first transistor T1, which is the only one which is ever bottomed, has a lower working voltage than do the others. This is necessary because the first stage, which receives the pulse for operating the stage, has to be a higher frequency transistor than do the others and this usually means a lower working voltage so that the bottomed charge decays rapidly.

In FIG. 2, R6 is greater than R7 and R8 is greater than R7.

Figure 3:
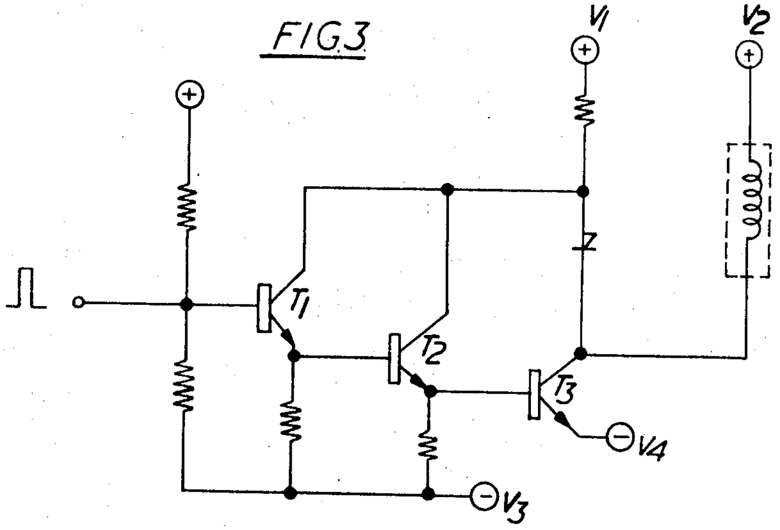
FIG. 3 shows a third embodiment without the diodes of the first two stages of FIG. 2.

In circuits such as shown, the diodes shown in FIGS. 1 and 2 can sometimes be omitted, with the exception of the diode for the last (power) stage. An example of such a circuit is shown in FIG. 3, which is a drive circuit for a ferrite memory access switch, the load L being one of the drive coils of the switch. It will be seen that in FIG. 3 the base bias of T1 is fixed by a bleeder tap.

Figure 4:
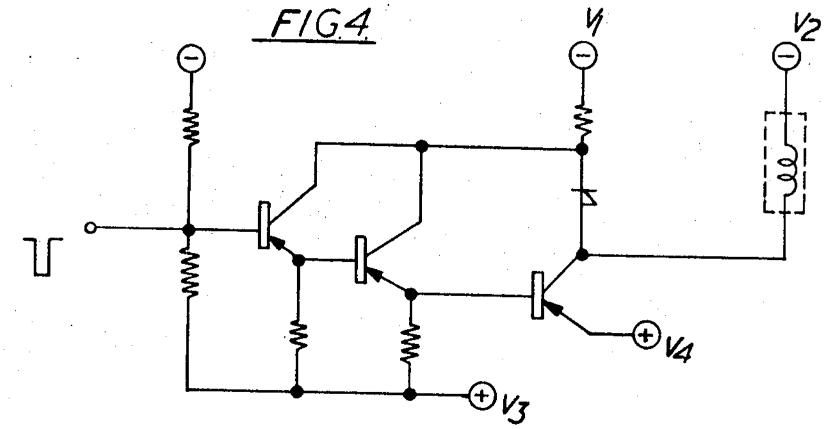
FIG. 4 is the same as FIG. 3 except that PNP transistors are used.

The circuits shown all use NPN transistors but can be used with PNP transistors, with bias and other voltages reversed, the input pulse to the base of T1 then being a negative pulse and, of course, the diodes reversed. Such a circuit is shown in FIG. 4, which is otherwise as FIG. 3.

The basis on which the action of these circuits depends is that the voltage between the collector of T1 and its base when T1 is saturated is less than that between the base and emitter of T2 when conducting but not saturated.

The load-driving element is T2 (FIG. 1), and it is desirable to keep T2 out of saturation when high speed is desired. The reason for this is that a transistor which will pass a relatively heavy current unsaturates slowly, and this effect would be rendered even worse where, as often applies, the load is inductive.

T1 is relatively high speed but low power transistor and when it is saturated its collector-emitter voltage is about 0.2 volt, whereas the base-emitter voltage of T2 is higher, usually about 0.9 volt with the silicon transistors usually used in this sort of circuit. There is nothing to stop T1 from saturating when it receives an input pulse via R4 but as it is a high speed transistor it will, when the pulse ends, unsaturate quickly. Such quick action would not be possible with a higher power transistor such as used in the T2 position (FIG. 1).

The input pulse is then current amplified by T1, which saturates and feeds extra current into the base of T2 so that the collector voltage of T2 falls as T2 responds to this extra current. In view of the potential divider effect of R1–D1–D2, since D1 and D2 have similar impedances, the fall in collector voltage of T2 reduces the collector voltage of T1. Hence T1 loses gain, so that it bottoms hard. This loss of gain tends to reduce the extra current fed into T2 base, so a self-adjusting feedback effect results.

The above action keeps T2 out of saturation but allows T1 to saturate. When the pulse ends, T1 unsaturates rapidly as it is a high speed transistor while T2 cuts off quickly as the feedback effect mentioned above ensures that T2 is never allowed to enter a saturated condition.

The diodes included in the circuit isolate the relatively high voltage part formed by the collector of the load-driving transistor, which has the additional connection to a supply via the load, from the first transistor T1. In almost all circuits using only two transistors both D1 and D2 would be required, as shown in FIG. 1. Where three transistors are used in series, the first two or possibly the first one, dependent on the characteristics of the transistors, may be superfluous. However, it should be emphasized that this will depend on the characteristics of the transistors used in the circuit.

It is to be understood that the foregoing description of specific examples of this invention is not to be considered as a limitation on its scope.

I claim:

1. A transistorized amplifier circuit arrangement comprising:

at least first and second stage transistors, said first transistor being a high speed, low power transistor in a common collector configuration and having its emitter connected to the base of said second transistor which is a high power transistor relative to said first transistor;

a common bias source coupled to the collectors of said first and second transistor by means of a common resistor;

a first diode located between the collector of said first transistor and said common resistance;

a second diode located between the collector of said second transistor and said common resistance;

a first bias source whose polarity is opposite to said common bias source is connected by respective resistors to the base and emitter of said first stage transistor;

a second bias source directly connected to the emitter of said second transistor, said second bias source having a polarity which is the same as said first bias source, but supplies a lesser voltage bias;

a load coupled between the collector of said second transistor and another voltage source;

an input signal source; and means coupling said source to said first transistor stage, the arrangement being such that during operation said first stage transistor can saturate and said second stage transistor cannot saturate.

2. A circuit according to claim 1, wherein said coupling means includes a third stage transistor in the common collector configuration, said third transistor having its emitter connected to the base of said first transistor and its base connected to said first bias source by an associated resistor, and the collector of said third transistor is connected to said common resistor by means of a third diode, whereby during operation of said circuit arrangement said third stage transistor can saturate and said second stage transistor cannot saturate.

3. A circuit according to claim 2, in which:

said transistors are NPN transistors;

said other voltage source connected by the load to the collector of said second stage transistor is a voltage of +30 volts;

said common bias source is at ground potential;

said first bias source is a voltage of −10 volts; and said second bias source is a voltage of −8 volts.

References Cited

FOREIGN PATENTS 1,316,040 12/1962 France.

968,475 9/1964 Great Britain.

ROY LAKE, *Primary Examiner.*

N. KAUFMAN, *Assistant Examiner.*